(12) United States Patent
Yoshida

(10) Patent No.: US 8,576,610 B2
(45) Date of Patent: Nov. 5, 2013

(54) SEMICONDUCTOR DEVICE HAVING FLOATING BODY TYPE TRANSISTOR

(75) Inventor: Soichiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 293 days.

(21) Appl. No.: 13/184,072

(22) Filed: Jul. 15, 2011

(65) Prior Publication Data

US 2012/0020144 A1    Jan. 26, 2012

(30) Foreign Application Priority Data

Jul. 23, 2010    (JP) .................................. 2010-166112

(51) Int. Cl.
*G11C 11/24*    (2006.01)

(52) U.S. Cl.
USPC ........................................................ 365/149

(58) Field of Classification Search
USPC ........................................................ 365/149
See application file for complete search history.

(56) References Cited

U.S. PATENT DOCUMENTS

| 6,034,391 A * | 3/2000 | Tobita ........................... 257/306 |
| 2008/0253159 A1* | 10/2008 | Kajigaya ......................... 365/51 |
| 2009/0201231 A1* | 8/2009 | Takahara et al. ................. 345/76 |
| 2010/0054065 A1* | 3/2010 | Kajigaya ........................ 365/205 |
| 2012/0127816 A1* | 5/2012 | Kajigaya et al. ............... 365/205 |

FOREIGN PATENT DOCUMENTS

JP    2010-055729 A    3/2010

* cited by examiner

*Primary Examiner* — Hoai V Ho
*Assistant Examiner* — Pablo Huerta
(74) *Attorney, Agent, or Firm* — Sughrue Mion, PLLC (57) ABSTRACT

A semiconductor device is disclosed in which a signal line and a drive circuit driving the signal line in response to a signal to be transmitted are provided. A transistor of a floating body type is further provided that includes a gate, a source, a drain, and a body between the source and drain which is brought into an electrically floating state. The gate is connected to the signal line, and at least one of the source and drain is connected to a control node that is supplied with a control signal. The control signal is configured to receive a control signal that changes from the first level to a second level during the period of time when the drive circuit is driving the signal node.

20 Claims, 10 Drawing Sheets

SEMICONDUCTOR DEVICE HAVING FLOATING BODY TYPE TRANSISTOR

BACKGROUND OF THE INVENTION

1. Field of the Invention

The present invention relates to a semiconductor device that includes a drive circuit driving a signal line in response to a signal to be transmitted or an amplifier amplifying a signal appearing on a signal line. Particularly, the present invention relates to a semiconductor device as a DRAM provided with a sense amplifier amplifying a read signal of a memory cell and a read amplifier amplifying an output signal of the sense amplifier.

2. Description of Related Art

In recent semiconductor device such as a DRAM, a large number of bit lines are required to be arranged in a memory cell array with a decrease in size and an increase in capacity, and thus a circuit scale of sense amplifiers connected to the bit lines tends to become large. Therefore, configurations capable of reducing the circuit scale have been proposed in which single-ended sense amplifiers are arranged instead of conventional differential type sense amplifiers (for example, refer to Patent Reference 1). A signal amplified by the sense amplifier is typically transmitted to a read amplifier through an I/O configuration such as a local input/output line and a main input/output line. In the DRAM employing the above-mentioned single-ended sense amplifiers, the subsequent IO configuration and the read amplifiers are desired to be of the single-ended type. In this manner, a configuration using single-ended type circuits including the sense amplifiers and subsequent circuits has an effect of reducing the circuit scale of the DRAM.

[Patent Reference 1] Japanese Patent Application Laid-open No. 2010-55729 (U.S. Pub. No. 2010/054065 A1)

When configuring the single-ended type read amplifier in the DRAM, a reference potential received in the differential type cannot be used, and therefore data transmitted from the sense amplifier to the read amplifier through an input/output line needs to have sufficient amplitude. In this case, by connecting an auxiliary capacitor, for example, to an input node of the read amplifier, a charge transfer via the auxiliary capacitor allows the amplitude of the input/output line to become large so that a signal having a large potential variation is transmitted to the read amplifier, and the transferred signal can be amplified by the read amplifier. However, on the assumption that a general MOS transistor is used as the above auxiliary capacitor, the MOS transistor has a characteristic in which a gate capacitance thereof increases unless a gate-source voltage Vgs is within a region near a threshold voltage. Therefore, the gate capacitance of the MOS transistor is visible from the input node before the amplifying operation of the read amplifier, and this causes a decrease in amplitude of the transmission signal, thereby decreasing operating margin of the read amplifier. In this manner, the present inventor has discovered a problem that it is difficult to improve the operating margin by obtaining the sufficient amplitude of the transmission signal by using the auxiliary capacitor that is not restricted by the characteristic of the MOS transistor.

SUMMARY

According to one of aspects of the invention, there is provided a semiconductor device that includes a signal line and a drive circuit driving the signal line in response to a signal to be transmitted are provided. A transistor of a floating body type is further provided that includes a gate, a source, a drain, and a body between the source and drain which is brought into an electrically floating state. The gate is connected to the signal line, and at least one of the source and drain is connected to a control node that is supplied with a control signal. The control signal is configured to receive a control signal that changes from the first level to a second level during the period of time when the drive circuit is driving the signal node.

Another aspect of the present invention is a semiconductor device comprising: a transmission circuit transmitting a signal to a signal line; an amplifier coupled to the signal line and performing an amplifying operation on a change in level of the signal line from an initial level; and a capacitor having a first electrode connected to the signal line and a second electrode supplied with a control signal, the capacitor comprising a first transistor of a floating body type including a gate, a source, a drain, and a body between the source and drain, the body being brought into an electrically floating state, the gate being connected to the first electrode, and at least one of the source and drain being connected to the second electrode; the first control signal being controlled during the amplifying operation by the amplifier to change from a first voltage level to a second voltage level.

According to the semiconductor device of the invention, when the signal amplified by the sense amplifier is transmitted to the input node of an amplification circuit through the transmission circuit, the first control signal supplied to the floating body type first transistor that has been set to the first voltage level is shifted to the second voltage level in the amplifying operation. At this point, the first transistor functions as an auxiliary capacitor, at first the gate capacitance of the first transistor is very small, and in contrast to this, the gate capacitance increases after the first control signal is shifted to the second voltage level so as to boost potential variation of the input node. Thus, in the initial period in which the first control signal is set to the first voltage level, the gate capacitance of the floating body type first transistor can be in an invisible state, and the signal can change in a higher speed, for example, compared to using a planer type transistor, thereby increasing the operating margin of the amplification circuit.

The present invention can be applied to various circuits. For example, the present invention can be applied to a configuration in which the above transmission circuit includes the first switch, the first input/output line, the second switch, the second input/output line and the third switch that are connected in this order. This configuration is generally employed in the DRAM as the semiconductor device. Particularly, the present invention is suitable for a single-ended configuration applied to all of the sense amplifier, the transmission circuit and the amplification circuit.

As described above, according to the present invention, in the configuration including the sense amplifier, the transmission circuit and the amplification circuit in the semiconductor device, the first transistor of the floating body type is used as the auxiliary capacitor by being connected to the input node of the amplification circuit, and a region where the gate capacitance of the first transistor is invisible in a C-V characteristic is effectively utilized. Therefore, the amplitude of the signal can be enlarged at the input node, and it is possible to achieve a high-speed operation by hastening the amplifying timing. Further, the sense amplifier can be relatively reduced in size corresponding to a difference in potential of the signal obtained in the first transistor, thereby reducing the chip area.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
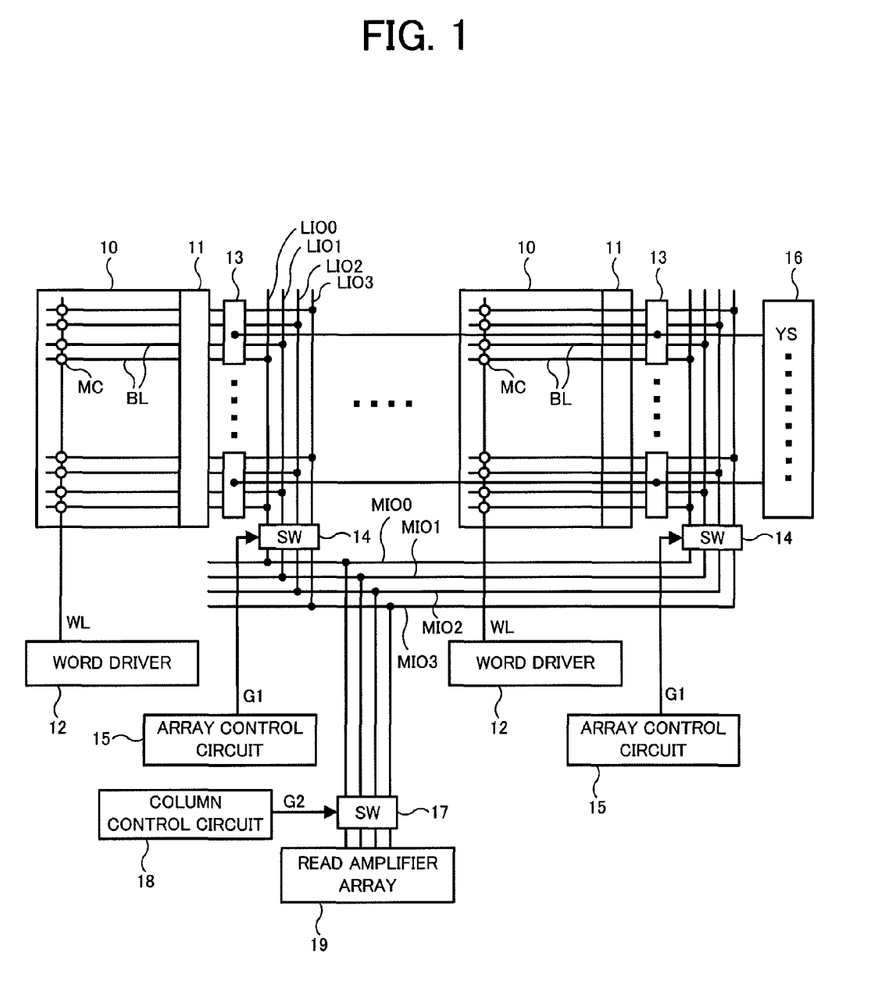
FIG. 1 is a block diagram showing an outline configuration of a memory cell array and column circuits in a DRAM of a first embodiment.

A first embodiment of the invention will be described below. FIG. 1 is a block diagram showing an outline configuration of a memory cell array and column circuits in the DRAM of the first embodiment. In the block diagram of FIG. 1, there are provided a plurality of memory cell arrays 10, and a sense amplifier array 11, a word driver 12, a predetermined number of column selection circuits 13, a switch circuit 14 and an array control circuit 15 that are attached to each of the memory cell arrays 10. Also, there are provided, a column decoder 16, a switch circuit 17, a column control circuit 18 and a read amplifier array 19 that are attached to the entire column circuits. The memory cell arrays 10 are aligned in a bit line direction together with the sense amplifier arrays 11 in a layout of the DRAM.

In each memory cell array 10, a plurality of word lines WL and a plurality of bit lines BL perpendicular to the word lines WL are arranged, and a plurality of memory cells MC are formed at intersections thereof. Each bit line BL is connected to a sense amplifier included in the sense amplifier array 11. A word line WL selected in the memory cell array 10 is driven by the word driver 12, and a signal is read out from a corresponding memory cell MC to the bit line BL. Then, the sense amplifier connected to the bit line BL amplifies a read signal and latches it.

The column selection circuit 13 controls connections between the bit lines BL and local input/output lines LIO in response to a column select signal YS supplied from the column decoder 16 (right end of FIG. 1). The column decoder 16 is disposed at one end of the plurality of memory cell arrays 10, and activates one of a predetermined number of column select signals YS, which corresponds to a decoding result of a Y address. In the example of FIG. 1, four local input/output lines LIO (LIO0 to LIO3) are arranged in parallel corresponding to each memory cell array 10. Thus, four bit lines BL and four local input/output lines LIO are configured to be connected to the column selection circuit 13.

The switch circuit 14 controls connections between the local input/output lines LIO and main input/output lines MIO in response to a gate control signal G1 supplied from the array control circuit 15. In the example of FIG. 1, the switch circuit 14 controls connections between four local input/output lines LIO (LIO0 to LIO3) and four main input/output lines MIO (MIO0 to MIO3). As shown in FIG. 1, a plurality of local input/output lines LIO corresponding to the plurality of memory cell arrays 10 are connected to common main input/output lines MIO through a plurality of switch circuits 14.

Here, FIG. 1 shows a case where the four local input/output lines LIO (LIO0 to LIO3) and the four main input/output lines MIO (MIO0 to MIO3) exist, however, a predetermined number of these lines can be provided without being limited to four.

The switch circuit 17 controls connections between the main input/output lines MIO and the read amplifier array 19 in response to a gate control signal G2 supplied from the column control circuit 18. The read amplifier array 19 includes a plurality of read amplifiers each amplifying a signal transmitted through each local input/output line LIO and each main input/output line MIO.

Next, in the DRAM of the first embodiment, a specific circuit configuration of a circuit portion associated with a read operation in the column circuits of FIG. 1 will be described with reference to FIG. 2. The circuit portion shown in FIG. 2 includes one sense amplifier 20 in the sense amplifier array of FIG. 1, one local input/output line LIO (the first input/output line of the invention) and one main input/output line MIO (the second input/output line of the invention) that are sequentially connected to the sense amplifier 20, and circuits attached thereto including the column selection circuit 13, respective switches in the switch circuits 14 and 17, and one read amplifier 21 in the read amplifier array 19.

Figure 3:
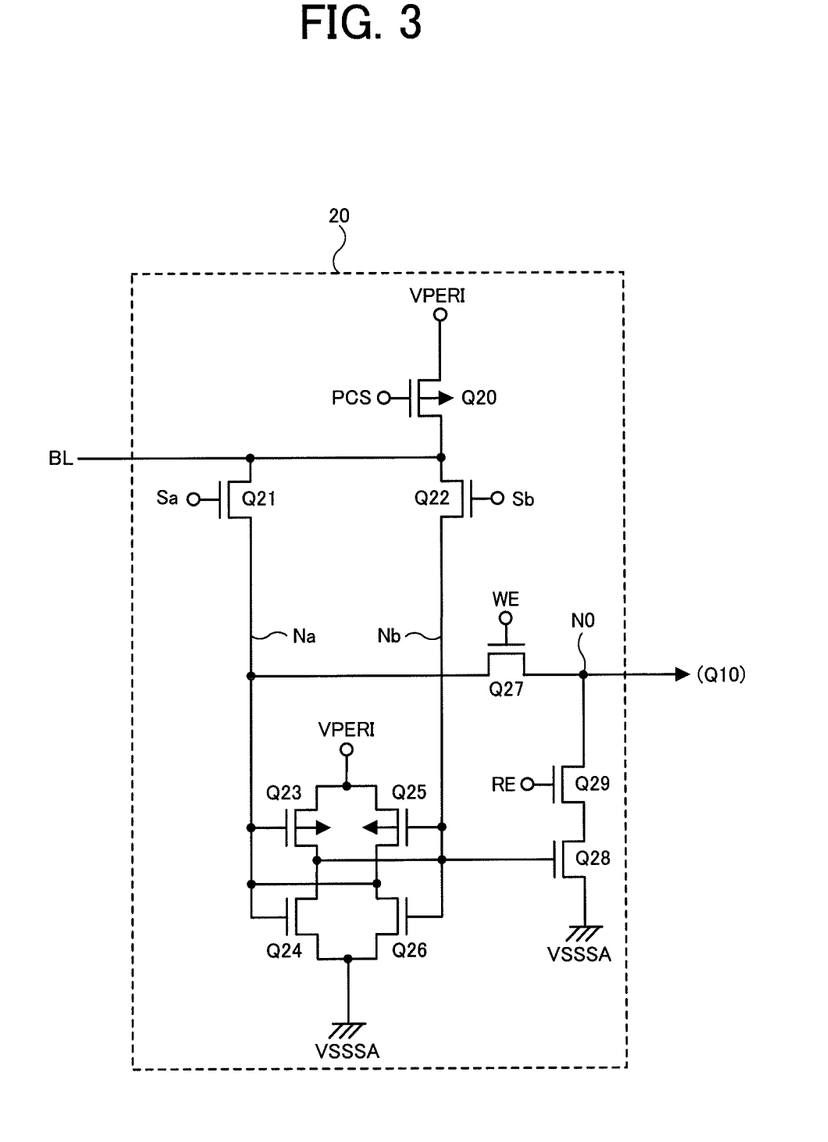
FIG. 3 is a diagram showing a specific circuit configuration example of a sense amplifier of FIG. 2.

The sense amplifier 20 amplifies a signal read out from a selected memory cell MC (FIG. 1) to the bit line BL, and outputs the amplified signal to a node N0. Here, as shown in FIG. 3, the sense amplifier 20 has a single-ended circuit configuration including three PMOS type transistors Q20, Q23 and Q25 and seven NMOS type transistors Q21, Q22, Q24, Q26, Q27, Q28 and Q29. The transistor Q20 precharges the bit line BL to an internal supply voltage VPERI in response to a control signal PCS applied to its gate. The transistor Q21 controls a connection between the bit line BL and a node Na in response to a control signal Sa applied to its gate. The transistor Q22 controls a connection between the bit line BL and a node Nb in response to a control signal Sb applied to its gate.

The transistors Q23, Q24, Q25 and Q26 form a latch circuit, which determines a signal voltage of the bit line BL in a binary value and latches it. A pair of transistors Q23 and Q24 forms an inverter whose input is the node Na, a pair of transistors Q25 and Q26 forms an inverter whose input is the node Nb, and these two inverters are cross-coupled to each other at their inputs and outputs. The transistor Q27 for a write operation is connected between the node Na and the node N0, and a control signal WE is applied to its gate. Two transistors Q28 and Q29 for a read operation are connected in series between the node N0 and a ground potential VSSSA. The node Nb is connected to the gate of the transistor Q28, and a read enable signal RE is applied to the gate of the transistor Q29.

Returning to FIG. 2, the NMOS type transistor Q10 is a switch (the first switch of the invention) included in the column selection circuit 13, which controls a connection between the node N0 that is an output node of the sense amplifier 20 and the local input/output line LIO. The transistor Q10 is controlled in response to the column select signal YS applied to its gate, and the node N0 and the local input/output line LIO are connected to each other when the column select signal YS is at a high level. The NMOS type transistor Q11 (the second precharge circuit of the invention) precharges the local input/output line LIO to a precharge voltage VBLP. The transistor Q11 is controlled in response to a control signal PCL applied to its gate, and the local input/output line LIO is precharged to the precharge voltage VBLP when the control signal PCL is at a high level. The NMOS type transistor Q12 is a switch (the second switch of the invention) included in the switch circuit 14, which controls a connection between the local input/output line LIO and the main input/output line MIO. The transistor Q12 is controlled in response to the gate control signal G1 applied to its gate, and the local input/output line LIO and the main input/output line MIO are connected to each other when the gate control signal G1 is controlled to be a predetermined potential.

The NMOS type transistor Q13 (the third precharge circuit of the invention) precharges the main input/output line MIO to the precharge voltage VBLP. The transistor Q13 is controlled in response to a control signal PCM applied to its gate, and the main input/output line MIO is precharged to the precharge voltage VBLP when the control signal PCM is at a high level. The NMOS type transistor Q14 is a switch (the third switch of the invention) included in the switch circuit 17, and controls a connection between the main input/output line MIO and a node N1 that is an input node of the read amplifier 21. The transistor Q14 is controlled in response to the gate control signal G2 applied to its gate, and the main input/output line MIO and the node N1 are connected to each other when the gate control signal G2 is controlled to be a predetermined potential.

In addition, the local input/output line LIO and the main input/output line MIO are combined with the transistors Q10, Q12 and Q14 as the switches to form the transmission circuit of the invention.

The NMOS type transistor QF (the first transistor of the invention) is a floating body type transistor having a gate connected to the node N1 of the read amplifier 21 and having a source and a drain to which a control signal CF (the first control signal of the invention) is commonly applied. That is, the transistor QF has a floating body structure including a body being brought into a floating state over a substrate via an insulating film, and functions as an auxiliary capacitor used for controlling a gate capacitance in response to the voltage relation of the gate and the source/drain. In the first embodiment, by connecting the floating body type transistor QF to the node N1 of the read amplifier 21, sufficient amplitude of an input signal to the read amplifier 21 can be generated due to coupling of the auxiliary capacitor, and a specific operation thereof will be described later.

Figure 2:
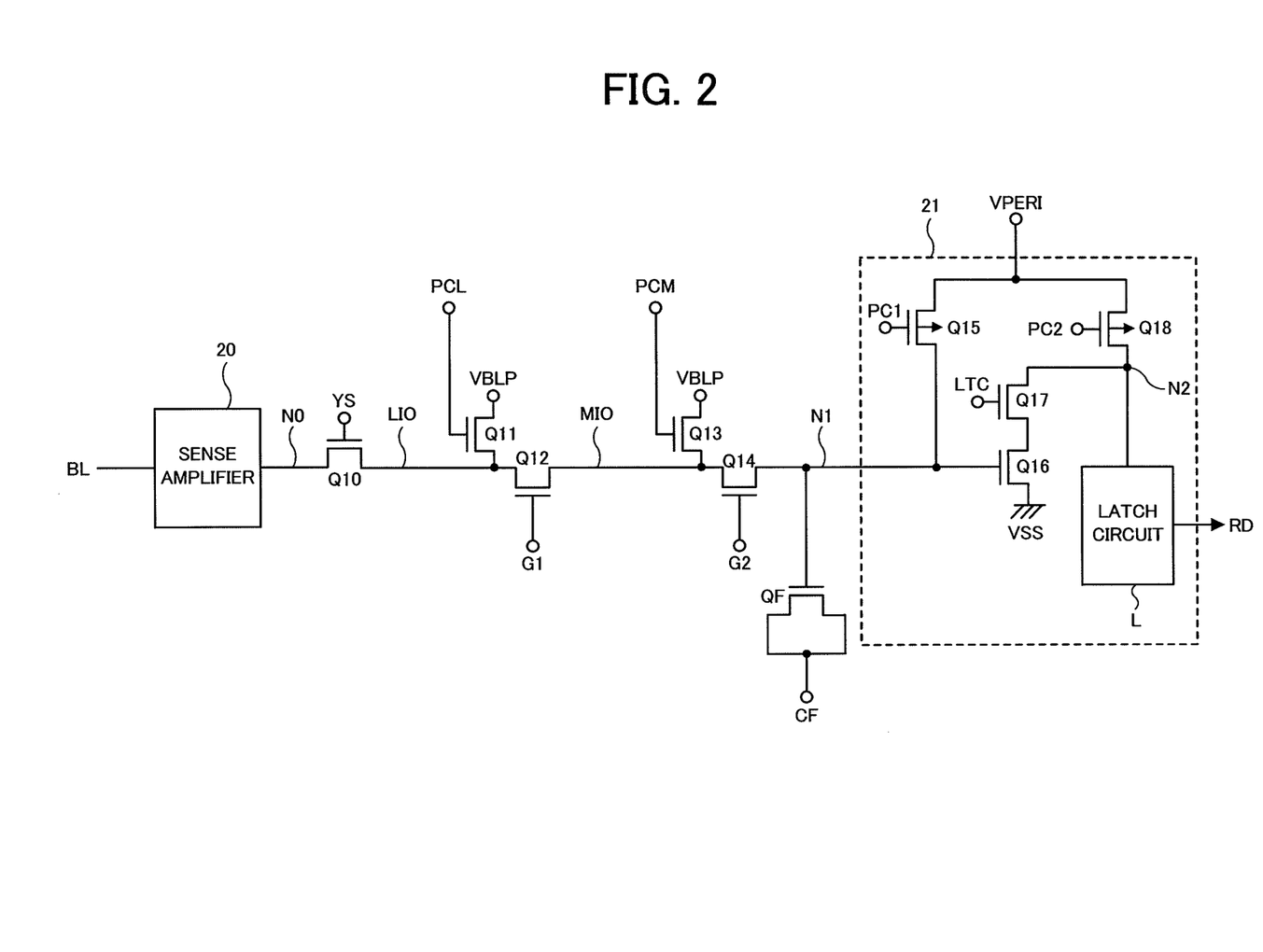
FIG. 2 is a diagram showing a specific circuit configuration of a portion in the column circuits in the DRAM of the first embodiment.

Although FIG. 2 shows the connection form in which the common control signal CF is applied to the source and drain of the transistor QF, a connection form may be modified so that the control signal CF is applied to either the source or the drain of the transistor QF.

The read amplifier 21 (the amplification circuit of the invention) is composed of transistors Q15 to Q18 and a latch circuit L. Two transistors Q16 and Q17 connected in series between a node N2 and a ground potential VSS operate as an amplifier in the read amplifier 21. The node N1 is coupled to the gate of the transistor Q16 (the second transistor of the invention) and a latch control signal LTC is applied to the gate of the transistor Q17 (the third transistor of the invention). A signal inputted to the read amplifier 21 through the node N1 is amplified by the transistor Q16, and a drain current of the transistor Q16 flows through the transistor Q17 so that the signal is transmitted to the node N2. When the transistor Q16 turns on in response to the potential of the node N1, the signal of the node N1 is transmitted to the node N2 by setting the latch control signal LTC to a high level. The node N2 is directly coupled to an input terminal of the latch circuit L, and data RD latched in the latch circuit L is inverted and outputted through an output terminal.

Meanwhile, the PMOS type transistor Q15 (the first precharge circuit of the invention) precharges the node N1 to the internal supply voltage VPERI. The transistor Q15 is controlled in response to a control signal PC1 applied to its gate, and the node N1 is precharged to the internal supply voltage VPERI when the control signal PC1 is at a low level. The PMOS type transistor Q18 precharges the node N2 in the read amplifier 21 to the internal supply voltage VPERI. The transistor Q18 is controlled in response to a control signal PC2 applied to its gate, and the node N2 is precharged to the internal supply voltage VPERI when the control signal PC2 is at a low level.

Figure 4:
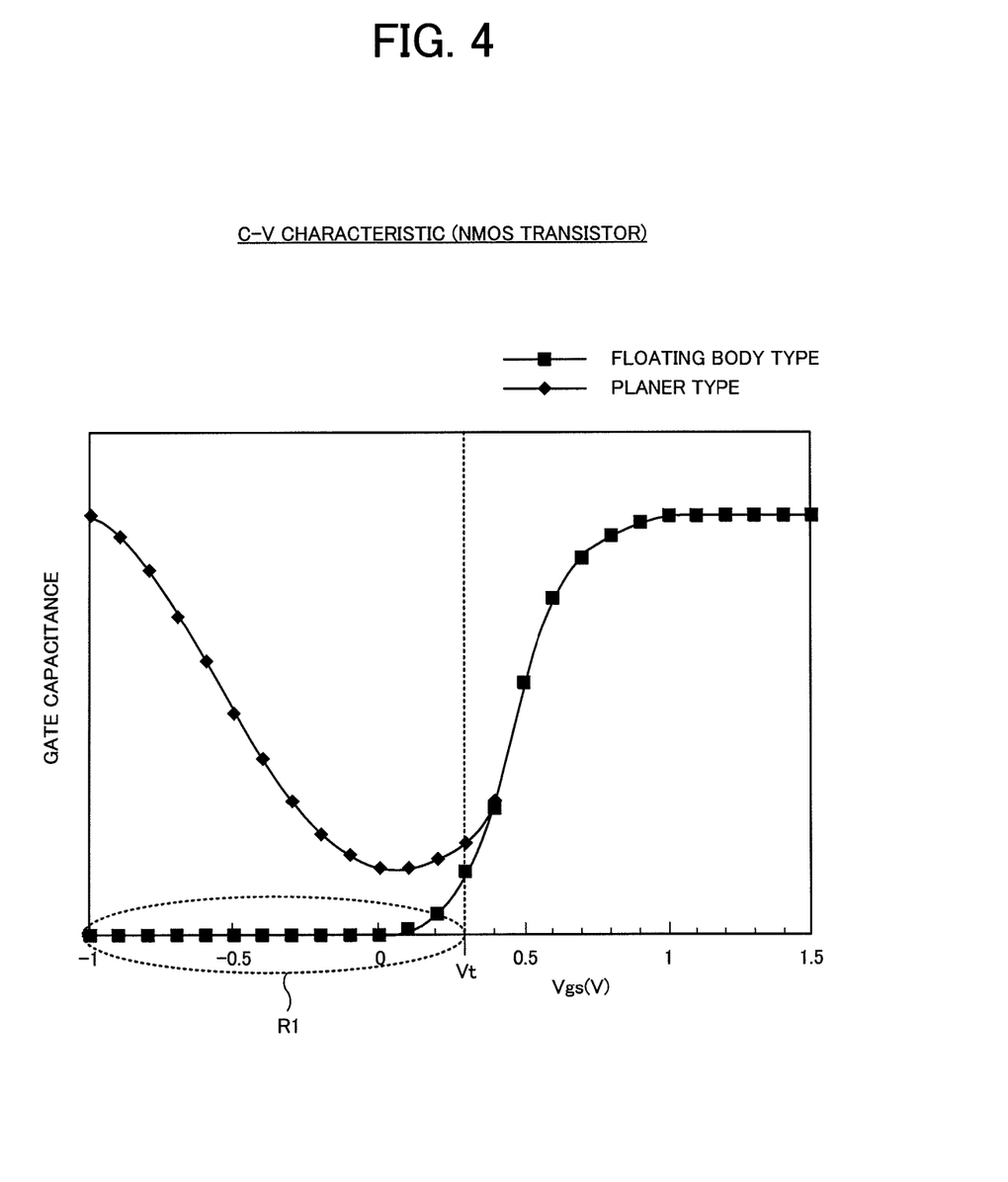
FIG. 4 is a diagram explaining a C-V characteristic in using a floating body type transistor.

Next, characteristics of the floating body type transistor QF used as the auxiliary capacitor of the node N1 of FIG. 2 will be described with reference to FIG. 4. FIG. 4 is a graph showing an example of C-V characteristics (relation between a gate-source voltage and a gate capacitance) in a general floating body type transistor. For the purpose of comparing with a characteristic of an NMOS transistor having another structure, FIG. 4 shows a C-V characteristic of a conventional planer type transistor that is overlapped with a C-V characteristic of the floating body type transistor. In FIG. 4, a gate-source voltage Vgs (hereinafter referred to simply as "Vgs") along a horizontal axis has a reference that is a threshold voltage Vt at the center (=0.3V). Here, voltage values of Vgs that are indicated along the horizontal axis are an example and can be properly adjusted.

As shown in FIG. 4, in a region where Vgs exceeds the threshold voltage Vt, respective gate capacitances of the floating body type transistor and the planer type transistor are approximately equal to each other, and as Vgs increases, the gate capacitances rapidly increase until reaching a predetermined level. This is because a capacitance between the gate and an inversion layer becomes dominant in each of the gate capacitances of the floating body type transistor and the planer type transistor in the region where Vgs exceeds the threshold voltage Vt.

In contrast, in a region where Vgs is lower than the threshold voltage Vt, the respective gate capacitances of the floating body type transistor and the planer type transistor change differently from each other. That is, as shown in FIG. 4, in a region R1 where Vgs is lower than the threshold voltage Vt in the floating body type transistor, a capacitance between the gate and a substrate is invisible since a body between the source and drain is in a floating state, so that the gate capacitance is approximately zero. On the other hand, in the planer type transistor, the gate capacitance decreases in a center region where Vgs is near the threshold voltage Vt, and the gate capacitance increases in a region where Vgs decreases relatively to the center region since influence of the capacitance between the gate and the substrate becomes larger.

In order to assist the signal of the node N1 as the input node of the read amplifier 21 to change upward in the circuit of FIG. 2, the characteristic of the floating body type transistor QF needs to be shifted from the left side to the right side in FIG. 4 so that charge transfer occurs. This control requires the control signal CF that is applied to the source and drain of the transistor QF of FIG. 2 to be changed from a high potential to a low potential. On the other hand, even when the same control is applied to the planer type transistor, since the gate capacitance is relatively high in a region on the left side of FIG. 4, the gate capacitance is visible from the node N1 in a state where the control signal CF is set to the initial high potential, thereby causing a problem that potential variation is hampered. Accordingly, by employing the floating body type transistor QF in the embodiments, the gate capacitance can be suppressed to almost zero in an initial period during which the signal of the node N1 is assisted to increase, thereby achieving higher speed in the potential variation of the signal.

Figure 5:
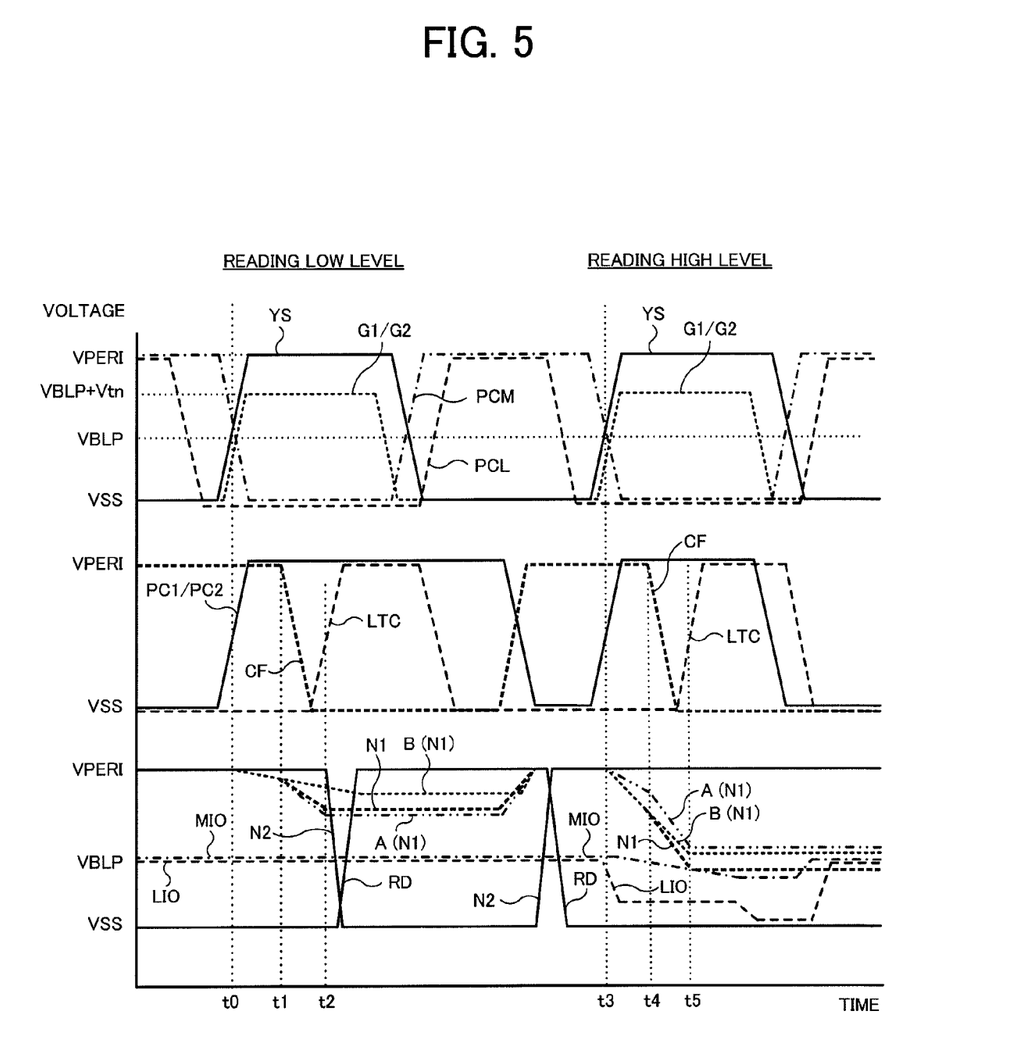
FIG. 5 is a diagram showing operation waveforms of a read operation in the DRAM of the first embodiment.

Next, a read operation of the circuit shown in FIG. 2 will be described with reference to FIG. 5. FIG. 5 shows operation waveforms of respective parts in the circuit of FIG. 2, which corresponds to a read operation of low-level data stored in the memory cell MC (the left side of FIG. 5) and a read operation of high-level data stored in the memory cell MC (the right side of FIG. 5). In FIG. 5, operation waveforms of the column select signal YS, the gate control signals G1, G2 and the control signals PCL and PCM are shown in an upper part, operation waveforms of the control signals CF, PC1 and PC2 and the latch control signal LTC are shown in a middle part, and operation waveforms of the local input/output line LIO, the main input/output line MIO, the nodes N1, N2 of the read amplifier 21 and the data RD are shown in a lower part. In addition, the high level of most of the operation waveforms of FIG. 5 is set to the internal supply voltage VPERI, and the low level thereof is set to the ground potential VSS.

In the initial period of FIG. 5, the control signals PCL and PCM are both at the high level, and the local input/output line LIO and the main input/output line MIO are both in a state of being precharged to the precharge voltage VBLP. Further, the control signal PC1 takes a low level so that the transistor Q15 precharges the node N1 up to a VPERI level as an initial (or precharge) level. At this time, the control signal also takes the VPERI level. While the node N1 and the signal CF thus takes the substantially same level (that is, the difference in level therebetween is substantially zero), the difference in level between the node N1 and the signal CF may be set not to be greater than the threshold level of the transistor QF. The gate capacitance of the transistor QF is thereby lowered. See FIG. 4, the left-side area. When reading the low-level data from the memory cell MC in this state, the read enable signal RE (FIG. 3) is changed to the high level by receiving a read command, and the control signal PCL is changed to the low level so that the precharging of the local input/output line LIO is cancelled. Subsequently, the column select signal YS is changed to the high level at a timing t0, and at the same time the control signal PCM is changed to the low level so that the precharging of the main input/output line MIO is cancelled. At this point, the gate control signal G1 applied to the gate of the transistor Q12 and the gate control signal G2 applied to the gate of the transistor Q14 are both controlled to be a voltage value obtained by adding an NMOS threshold voltage Vtn to the precharge voltage VBLP (VBLP+Vtn). Thereby, the low-level data latched in the sense amplifier 20 is transmitted to the node N1 as the input node of the read amplifier 21 through the node N0, the local input/output line LIO and the main input/output line MIO.

When reading the low-level data from the memory cell MC, the node Nb in the sense amplifier 20 goes to the low level. Thus, even when the read enable signal RE (FIG. 3) applied to the gate of the transistor Q29 in the sense amplifier 20 goes to the high level, since the transistor Q28 remains off, the charge of the local input/output line LIO is not drawn through these transistors into the ground potential VSSSA. Therefore, the local input/output line LIO is maintained at the precharge voltage VBLP, so that the transistor Q12 does not turn on based on a relationship with the gate potential. Similarly, the main input/output line MIO is also maintained at the precharge voltage VBLP, so that the transistor Q14 also does not turn on. Further, since the transistor Q14 remains off, the potential of the node N1 slightly decreases due to influence of OFF current, and is basically maintained at the internal supply voltage VPERI.

As shown in FIG. 5, the control signal CF applied to the source and drain of the transistor QF is shifted from the internal supply voltage VPERI (the first voltage level of the invention) of the high level to the ground potential VSS (the second voltage level of the invention) of the low level at a timing t1. The gate capacitance of the transistor QF changes upward in response to the control signal CF at this point, and the potential of the node N1 gradually decreases due to coupling between the transistor QF and the node N1. Then, the latch control signal LTC applied to the gate of the transistor Q17 goes to the high level at a timing t2, and the signal amplified by the transistor Q16 is transmitted to the latch circuit L via the node N2. In this case, it is required to adjust the threshold voltage and various parameters of the transistor QF so that the transistor Q16 is sufficiently maintained in an ON state at the timing t2. Thereby, the charge of the node N2 is drawn through the transistors Q17 and Q16, and the potential of the node N2 changes from the high level to the low level. Accordingly, latching state of the latch circuit L is inverted, and the data RD outputted from the latch circuit L is inverted from the low level to the high level.

Here, an operation waveform A(N1) of the node N1 in which the transistor QF is replaced with a planer type transistor and an operation waveform B(N1) of the node N1 in which the transistor QF is not connected to the node N1 are overlapped in FIG. 5 in order to compare them with the operation waveforms of the node N1 in which the floating body type transistor QF is used. Within a range between timings t1 and t2 in the read operation of the low-level data, the operation waveform B(N1) is higher than the potential of the node N1, while the operation waveform A(N1) is approximately equal to the potential of the node N1. That is, in the read operation of the low-level data, a difference between characteristics of the floating body type and the planer type is not so much reflected in a difference between potential variations thereof. As to the operation waveform B (N1), the potential variation is moderate since there is no coupling due to the transistor QF within the range between timings t1 and t2.

Thereafter, the potentials of the gate control signals G1 and G2 are returned to the low level, and the local input/output line LIO, the main input/output line MIO and the node N1 are disconnected from one another. Subsequently, the column select signal YS and the latch control signal LTC are changed from the high level to the low level, the control signals PCM and PCL are changed from the low level to the high level, and the local input/output line LIO and the main input/output line MIO are precharged to the precharge voltage VBLP again. At the same time, since the control signal CF is returned from the low level to the high level, the gate capacitance of the transistor QF changes downward, and thereby the potential of the node N1 gradually rises. Thereafter, the latching state of the latch circuit L is inverted again, and the data RD outputted from the latch circuit L returns to the low level.

Next, when reading the high-level data from the memory cell MC, controls around a timing t3 are performed in almost the same manner as for the timing t0. At this point, since the node Nb in the sense amplifier 20 goes to the high level and the transistors Q10 and transistors Q28 and Q29 in the sense amplifier 20 have turned on respectively at the timing t3, the charge of the local input/output line LIO is drawn into the ground potential VSSSA. Therefore, as shown in the lower part of FIG. 5, since the potential of the local input/output line LIO sufficiently decreases, the transistor Q12 turns on based on the relationship with the gate potential, and the charge of the main input/output line MIO also starts to be drawn. Thereby, the potential of the main input/output line MIO gradually decreases, the transistor Q14 turns on based on the relationship with the gate potential, and the charge of the node N1 of the read amplifier 21 also starts to be drawn.

In a charge transfer operation from the node N1 to the local input/output line LIO through the main input/output line MIO, the charge drawn into the local input/output line LIO is mainly supplied from the node N1, and thus the potential variation of the node N1 is larger than the potential variation of the main input/output line MIO. Meanwhile, when the control signal CF is shifted from the high level to the low level at a timing t4, the gate capacitance of the transistor QF changes upward. Thereby, the coupling between the transistor QF and the node N1 allows the potential variation of the node N1 to become larger so that the potential of the node N1 rapidly decreases. Then, when the latch control signal LTC goes to the high level at a timing t5, the gate potential of the transistor Q16 connected to the node N1 decreases so that a sufficient current does not flow through the transistors Q16 and Q17, and thus the latch circuit L cannot be inverted. Accordingly, the read amplifier 21 remains in the initial state, and the data RD outputted from the latch circuit L is maintained at the low level. Thereafter, the potential of the gate control signals G1 and G2 is returned to the low level, and subsequent operations are performed in almost the same manner as the read operation of the low-level data.

Also as to the read operation of the high-level data, the operation waveforms of the node N1 in which the floating body type transistor QF is used differ from the operation waveform A(N1) in which the transistor QF is replaced with the planer type transistor and the operation waveform B(N1) in which the transistor QF is not connected to the node N1. That is, the operation waveform A(N1) decreases more gradually than the potential of the node N1 within a range between timings t3 and t4. This is because in case of the planer type transistor, the gate capacitance is visible from the node N1 in a region where Vgs of the transistor QF is low (the left side of the graph of FIG. 4) and thus the potential variation is suppressed. On the other hand, within a range between timings t4 and t5, the transistor QF transitions to a region where Vgs thereof is high in response to the control signal CF so that the floating body type transistor and the planer type transistor have almost the same gate capacitance (the right side of the graph of FIG. 4) and thus slopes of both the potential variations after the control signal CF is changed to the low level match each other. However, a difference in potential between the both that occurs within the range between timings t3 and t4 cannot be compensated. As to the operation waveform B(N1), the potential variation is moderate since there is no coupling due to the transistor QF within the range between timings t4 and t5.

As described above, at the timing T5, the difference in potential relative to the internal supply voltage VPERI is maximized at the node N1 where the floating body type transistor QF is used, in comparison with the operation waveforms A(N1) and B(N1) as comparison targets. Accordingly, the inverting timing of the latch circuit L is earlier for the operation waveform of the node N1 in the case of using the transistor QF than for the operation waveforms A(N1) and B(N1). Thereby, the read operation can be performed by the read amplifier 21 with a higher speed. Further, when setting the timings in the read operation using the transistor QF to be equal to those for the operation waveforms A(N1) and B(N1), it is possible to correspondingly improve operating margin. In addition, the effects described in the above first embodiment are basically common in the following second embodiment.

Second Embodiment

Figure 6:
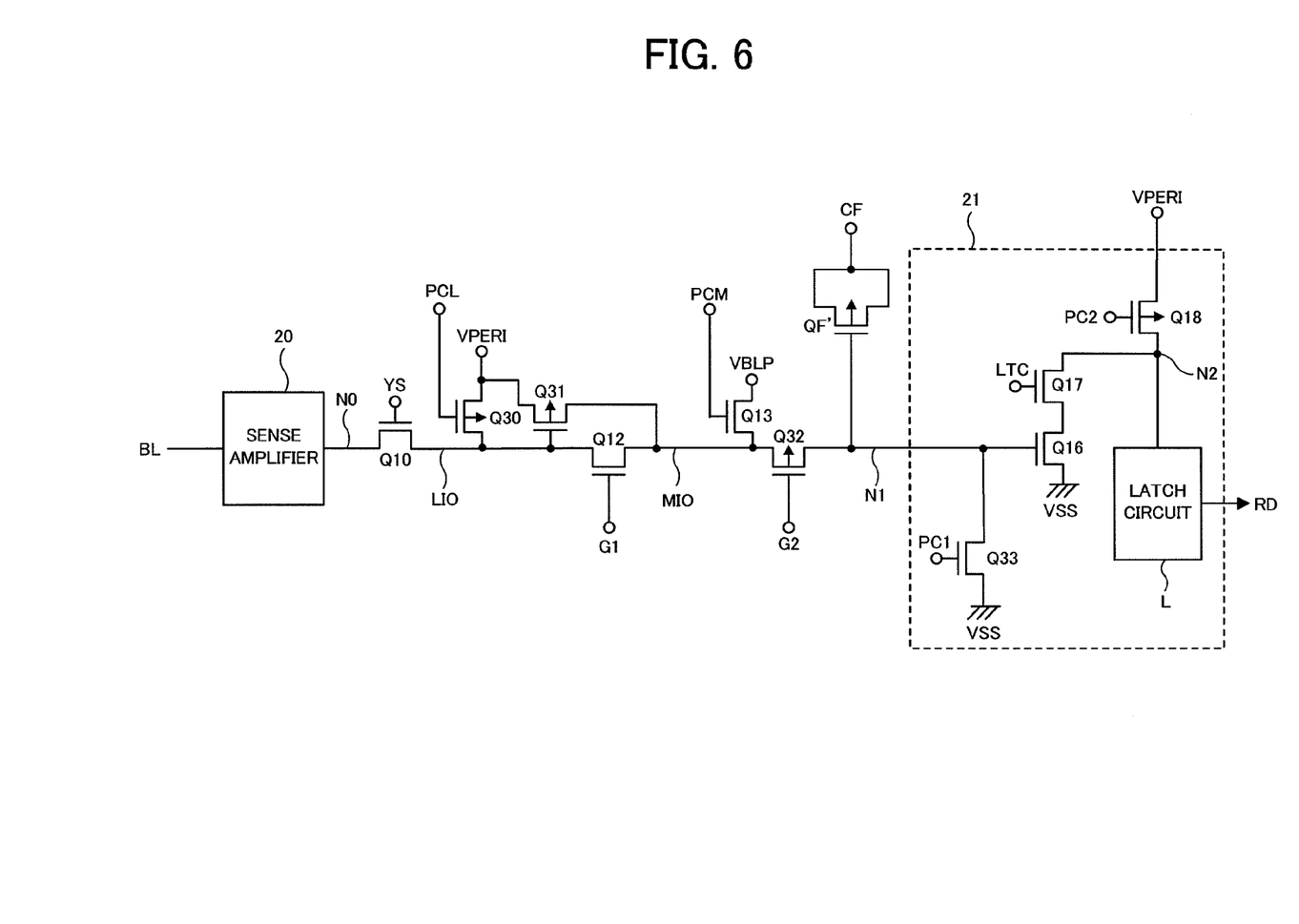
FIG. 6 is a diagram showing a specific circuit configuration of a portion in the DRAM of a second embodiment.

A second embodiment of the invention will be described below. The configuration of FIG. 1 described in the first embodiment is common in the DRAM of the second embodiment, and thus description thereof will be omitted. FIG. 6 shows a specific circuit configuration of a circuit portion associated with the read operation in the DRAM of the second embodiment. The circuit portion shown in FIG. 6 includes many portions that are the same as those in FIG. 2 of the first embodiment including the sense amplifier 20 and the read amplifier 21, and differs from FIG. 2 in that there is a configuration for precharging the node N1 with a reverse polarity. That is, as shown in FIG. 6, PMOS type transistors Q30 and Q31 are provided instead of the NMOS type transistor Q11 of FIG. 2, a PMOS type transistor Q32 is provided instead of the NMOS type transistor Q14 of FIG. 2, an NMOS type transistor Q33 is provided instead of the PMOS type transistor Q15 of the read amplifier 21 of FIG. 2, and a PMOS type transistor QF' is provided instead of the NMOS type transistor QF of FIG. 2.

The transistor Q30 (the second precharge circuit of the invention) precharges the local input/output line LIO to the internal supply voltage VPERI. The transistor Q30 is controlled in response to the control signal PCL applied to its gate, and the local input/output line LIO is precharged to the internal supply voltage VPERI when the control signal PCL is at the low level. The transistor Q31 controls a connection between the internal supply voltage VPERI and the main input/output line MIO in response to the potential of the local input/output line LIO connected to its gate. The transistor Q32 (the third switch of the invention) controls a connection between the main input/output line MIO and the node N1. The transistor Q32 is controlled in response to the gate control signal G2 applied to its gate, and the main input/output line MIO and the node N1 are connected to each other when the gate control signal G2 is controlled to be the predetermined voltage. The transistor Q33 (the first precharge circuit of the invention) of the read amplifier 21 precharges the node N1 to the ground potential VSS. The transistor Q33 is controlled in response to the control signal PC1 applied to its gate, and the node N1 is precharged to the ground potential VSS when the control signal PC1 is at the high level.

The PMOS type transistor QF' functioning as the auxiliary capacitor is a floating body type transistor having a gate connected to the node N1 of the read amplifier 21 and a source and a drain being commonly supplied with the control signal CF. The transistor QF' of FIG. 6 has a C-V characteristic that may be obtained by reversing the polarity of Vgs in the C-V characteristic shown in FIG. 4. Thus, in an amplifying operation of the read amplifier 21, the control signal CF is shifted from the high potential to the low potential in FIG. 2, and in contrast the control signal CF may be shifted from the low potential to the high potential in FIG. 6.

Figure 7:
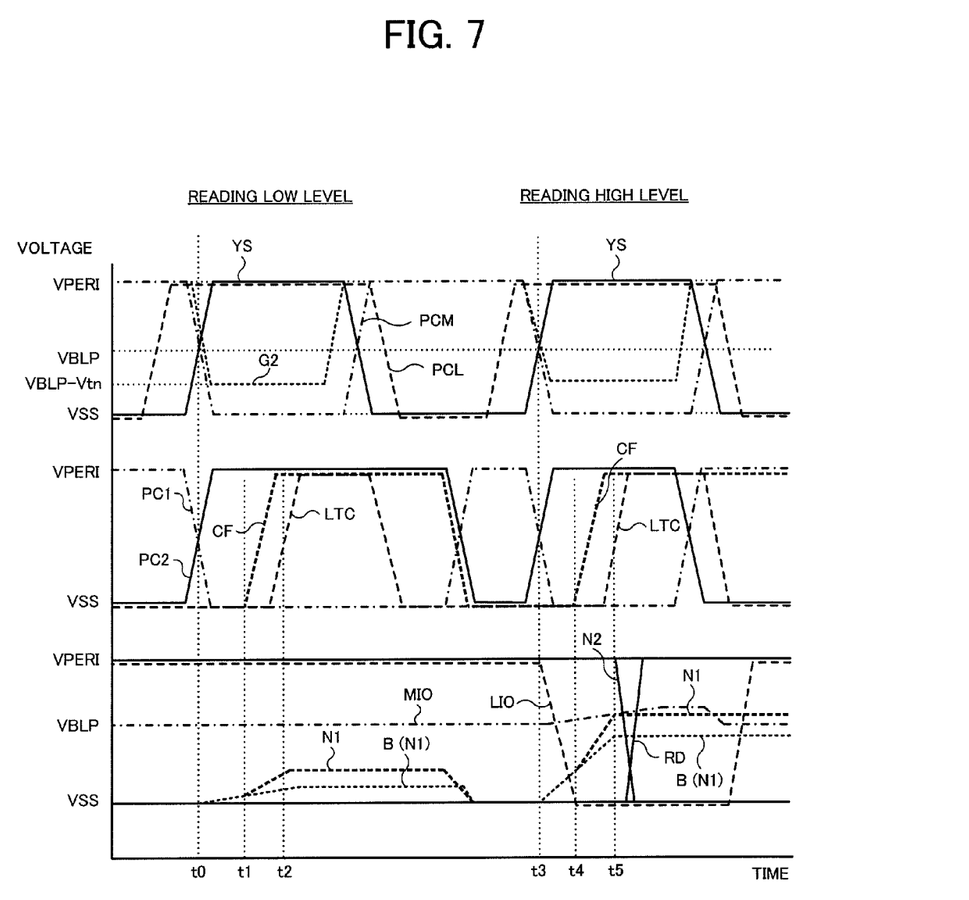
FIG. 7 is a diagram showing operation waveforms of the read operation in the DRAM of the second embodiment.

Next, a read operation of the circuit shown in FIG. 6 will be described with reference to FIG. 7. FIG. 7 shows operation waveforms of respective parts in the circuit of FIG. 6, which corresponds to FIG. 5. Most of the operation waveforms of FIG. 7 are common to those in FIG. 5, and thus differences in the operation waveforms of FIG. 7 from FIG. 5 will be mainly described below. First, when reading the low-level data from the memory cell MC, the control signal PCL is at the low level and the control signal PCM is at the high level in the initial period. Also, the local input/output line LIO has been precharged to the internal supply voltage VPERI and the main input/output line MIO has been precharged to the precharge voltage VBLP, due to the operations of the transistors Q30, Q31 and Q13, as described above. Further, in the initial period, the control signal PC1 is at the high level, and the node N1 of the read amplifier 21 has been precharged to the ground potential VSS. In addition, these precharge states will be sequentially cancelled by inverting controls of the control signals PCL, PCM and PC1.

When reading the low-level data from the memory cell MC, the local input/output line LIO is maintained at the internal supply voltage VPERI and the main input/output line MIO is maintained at the precharge voltage VBLP, based on the above-mentioned voltage relation. Further, the potential variation of the node N1 has polarities reverse to those in FIG. 5 within a range between timings t0 and t2. That is, since the control signal CF is shifted from the ground potential VSS (the first voltage level of the invention) of the low level to the internal supply voltage VPERI (the second voltage level of the invention) of the high level at the timing t1, the gate capacitance of the transistor QF' changes upward, and the potential of the node N1 gradually rises due to coupling between the transistor QF' and the node N1. Then, the latch control signal LTC is changed to the high level at the timing t2, and it is necessary to adjust the threshold voltage and various parameters of the transistor QF' so that the transistor Q16 remains in the OFF state sufficiently. Thereby, the gate potential of the transistor Q16 connected to the node N1 is kept low so that the charge of the node N2 is not drawn, the latching state of the latch circuit L is maintained, and the data RD is maintained at the low level.

Next, when reading the high-level data from the memory cell MC, controls around the timing t3 are performed in almost the same manner as for the timing t0. At this point, the charge of the local input/output line LIO is drawn in the same manner as in FIG. 5, and the potential thereof rapidly decreases from the internal supply voltage VPERI to the ground potential VSS. Thereby, the transistor Q31 turns on, and the main input/output line MIO is charged through the transistor Q31. At this point, since the potential of the main input/output line MIO becomes higher than the precharge voltage VBLP, the transistor Q32 turns on based on the relationship with the gate potential, and the node N1 of the read amplifier 21 is being charged.

In this case, a path of the charge transfer in FIG. 6 is reverse to that in FIG. 2, the charge supplied mainly from the local input/output line LIO is lost to the node N1, and the potential variation of the node N1 is larger than the potential variation of the main input/output line MIO. Meanwhile, the control signal CF is changed from the low level to the high level at the timing t4, the gate capacitance of the transistor QF' changes upward and rapidly increases due to that the above effect enlarges the potential variation of the node N1. Then, when the latch control signal LTC is changed to the high level at the timing t5, the gate potential of the transistor Q16 connected to the node N1 increases so that a sufficient current flows through the transistors Q16 and Q17, and the latch circuit L is inverted. Thus, the data RD outputted from the latch circuit L is inverted from the low level to the high level. Subsequent operations are performed in almost the same manner as the read operation of the low-level data.

In FIG. 7, as to the operation waveform of the node N1 in which the floating body type transistor QF' is used, the operation waveform B(N1) in which no transistor is connected is shown similarly as in FIG. 5. In this case, the operation waveform B(N1) in FIG. 7 corresponds to a voltage relation reverse to that in FIG. 5. As described above, in the DRAM of the second embodiment, the same effects as in the DRAM of the first embodiment can be obtained.

[Device Structure]

Figure 8:
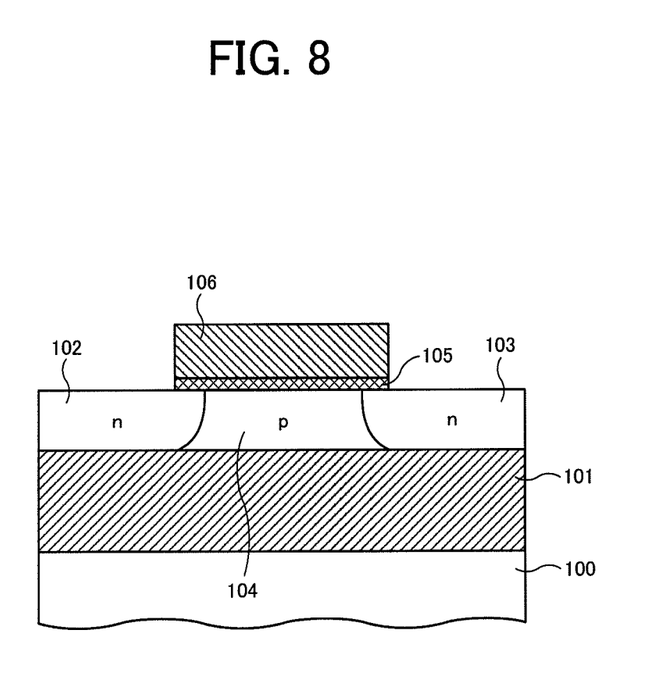
FIG. 8 is diagram showing a structural example of a MOS transistor using SOI structure.

In the following, device structures of the floating body type transistor used in the first and second embodiments will be described below with reference to FIGS. 8 to 10. FIG. 8 shows a structural example of a MOS transistor using SOI (Silicon on Insulator) structure. In the structural example of FIG. 8, an insulating film 101 is formed on a silicon substrate 100, and, for example, N type source-drain diffusion layers 102 and 103 are formed on both sides on the insulating film 101. For example, a P-type body region 104 is formed in a region between the source-drain diffusion layers 102 and 103. A gate electrode 106 is formed over the body region 104 via a gate insulating film 105. As described above, the body region 104 is electrically separated from the surrounding parts so as to be in the floating state.

Figure 9:
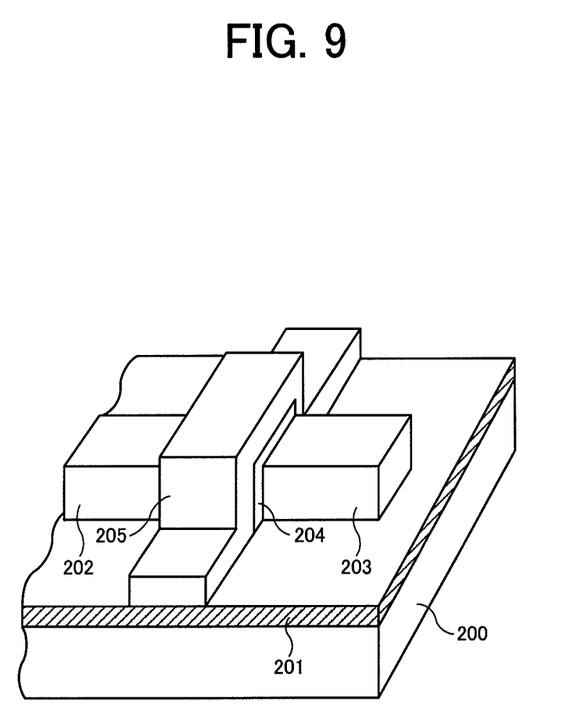
FIG. 9 is a diagram showing a structural example of a MOS transistor using Fin-FET structure.

FIG. 9 is a perspective view showing a structural example of a MOS transistor using Fin-FET structure. In the structural example of FIG. 9, an insulating film 201 is formed on a silicon substrate 200, and a so-called Fin between source/drain electrodes 202 and 203 on the insulating film 201 functions as a body. A gate electrode 205 is formed over the Fin via a gate insulating film 204. The body under the gate electrode 205 is electrically separated from the surrounding parts so as to be in the floating state.

Figure 10:
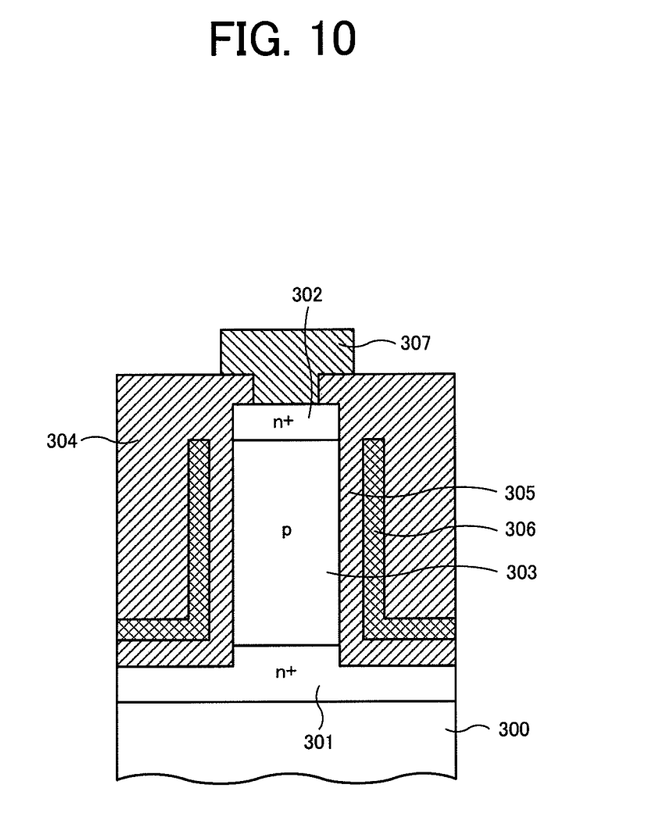
FIG. 10 is a diagram showing a structural example of a MOS transistor using pillar-shaped structure.

FIG. 10 shows a structural example of a MOS transistor using pillar-shaped structure. In the structural example of FIG. 10, for example, N+ type source/drain regions 301 and 302 are formed in lower and upper layers of a pillar-shaped region over a silicon substrate 300, and a body 303 as, for example, a P-type region is formed between the source/drain regions 301 and 302. An interlayer insulating film 304 surrounds the pillar-shaped region, and a gate electrode 306 surrounding the body 303 via a gate insulating film 305 is formed inside the interlayer insulating film 304. A wiring layer 307 used as, for example, a bit line is formed over the source/drain region 302. Also, in this structural example, the body 303 is electrically separated from the surrounding parts so as to be in the floating state.

In the foregoing, the preferred embodiments of the present invention have been described. However the present invention is not limited to the above embodiments and can variously be modified without departing the essentials of the present invention. For example, in FIGS. 2 and 6, the circuit configurations of the sense amplifier 20 and the read amplifier 21 can be appropriately modified. Further, the configuration of the transmission circuit including the local input/output line LIO and the main input/output line MIO can be appropriately modified in accordance with specifications of the semiconductor device.

The present invention can be applied to a circuit configuration in which a signal driver (or a signal transmission circuit) and an amplification circuit are coupled with each other via a signal line and a capacitor including a MOS transistor is connected to the signal line to assist a change in level on the signal line responsive to a signal from the signal driver/transmission circuit. Such configuration may be included in various semiconductor devices such as CPU (Central Processing Unit), MCU (Micro Control Unit), DSP (Digital Signal Processor), ASIC (Application Specific Integrated Circuit), ASSP (Application Specific Standard Product) and the like, in addition to the DRAM. Further, the present invention can be applied to various device structures such as SOC (System on Chip), MCP (Multi Chip Package) and POP (Package on Package) and the like. Furthermore, various transistors can be used in the embodiments. For example, a field-effect transistor (FET) can be used in the embodiments, and various types of FETs such as MIS (Metal-Insulator Semiconductor), TFT (Thin Film Transistor), and the like can be used in the embodiments.

The invention claimed is:

1. A semiconductor device comprising:
a signal line;
a control node;
a transistor of a floating body type including a gate, a source, a drain, and a body between the source and drain, the body being brought into an electrically floating state, the gate being connected to the signal line; and at least one of the source and drain being connected to the control node; and
a drive circuit driving the signal line in response to a signal to be transmitted;
the control node being configured to receive a control signal that takes a first level during a period of time when the drive circuit is driving the signal node and changes from the first level to a second level during the period of time when the drive circuit is driving the signal node.

2. The semiconductor device as claimed in claim 1, wherein the drive circuit drives the signal line from an initial level to a signal level responsive to the signal to be transmitted, a difference between the initial level and the first level being not greater than a threshold level of the transistor and a difference between the initial level and the second level being greater than the threshold level of the transistor.

3. The semiconductor device as claimed in claim 2, wherein the difference between the initial level and the first level being substantially zero.

4. The semiconductor device as claimed in claim 1, further comprising a precharge circuit precharging the signal line to an initial level, and a switch circuit coupled between the signal line and the drive circuit and rendered nonconductive to disconnect the signal line from the drive circuit during the precharge circuit precharging the signal line.

5. The semiconductor device as claimed in claim 4, wherein the control signal takes the initial level as the first level during the precharge circuit precharging the signal line, and the switch circuit is rendered conductive to connect the signal line to the drive circuit after the precharge circuit suspends precharging the signal line.

6. The semiconductor device as claimed in claim 1, wherein the drive circuit comprises a plurality of memory cells and at least one sense amplifier, the sense amplifier receiving as the signal to be transmitted a data signal stored in a selected one of the memory cells.

7. A semiconductor device comprising:
a transmission circuit transmitting a signal to a signal line;
an amplifier coupled to the signal line and performing an amplifying operation on a change in level of the signal line from an initial level; and
a capacitor having a first electrode connected to the signal line and a second electrode supplied with a control signal, the capacitor comprising a first transistor of a floating body type including a gate, a source, a drain, and a body between the source and drain, the body being brought into an electrically floating state, the gate being connected to the first electrode, and at least one of the source and drain being connected to the second electrode;
the first control signal being controlled during the amplifying operation by the amplifier to change from a first voltage level to a second voltage level.

8. The semiconductor device as claimed in claim 7, wherein the initial level being substantially equal to the first voltage level.

9. The semiconductor device as claimed in claim 8, wherein the first transistor is of an NMOS type, and the first voltage level is higher than the second voltage level.

10. The semiconductor device as claimed in claim 8, wherein the first transistor is of a PMOS type, and the first voltage level is lower than the second voltage level.

11. The semiconductor device as claimed in claim 7, wherein the amplifier comprises a precharging circuit that is activated to precharge the signal line to the initial level prior to the amplifying operation.

12. The semiconductor device as claimed in claim 11, wherein the amplifier further comprises a second transistor including a gate connected to the signal line.

13. A semiconductor device comprising:
a memory cell array including a plurality of word lines, a plurality of bit lines intersecting the bit lines, and a plurality of memory cells disposed at different one of intersections of the word and bit lines;
a plurality of sense amplifiers each coupled to an associated one of the bit lines;
a data line;
a switch circuit operatively coupling a selected one of the sense amplifiers to the data line;
a data amplifier coupled to the data line and, when activated, configured to amplify a data signal appearing on the data line;
a control node supplied with a control signal; and
a transistor including a gate, a source, a drain and a body between the source and drain, the gate being connected to the data line, at least one of the source and drain being connected to the control signal node, and the body being brought into an electrically floating state;
the control signal being changed from a first level to a second level during the data amplifier being activated.

14. The semiconductor device as claimed in claim 13, wherein the data line takes an initial level prior to the data signal appearing on the data line, a difference between the initial level and the first level being not greater than a threshold level of the transistor, and a difference between the initial level and the second level being greater than the threshold level of the transistor.

15. The semiconductor device as claimed in claim 14, wherein the initial level and the first level are substantially equal to each other to make the difference between the initial level and the first level substantially zero.

16. The semiconductor device as claimed in claim 15, wherein each of the initial level and the first level takes one of a logic low level and a logic high level and the second level takes the other of the logic low level and the logic high level.

17. The semiconductor device as claimed in claim 15, wherein the data line comprises a first data line and a second data line, and the device further comprises a switch between the first and second data lines, the first data line being provided on a side of the switch circuit and the second data line being provided on a side of the data amplifier, the switch being rendered conductive with the data amplifier being activated.

18. The semiconductor device as claimed in claim 15, wherein the data lines comprises first, second and third data lines, and the device further comprises a first switch between the first and second data lines and a second switch between the second and third data lines, the first data line being provided on a side of the switch circuit and the third data line being provided on a side of the data amplifier, the first and second switches being rendered conductive with the data amplifier being activated.

19. The semiconductor device as claimed in claim 14, wherein the transistor is of an N-channel type, each of the initial level and the first level taking a logic high level and the second level taking a logic low level.

20. The semiconductor device as claimed in claim 14, wherein the transistor is of an P-channel type, each of the initial level and the first level taking a logic low level and the second level taking a logic high level.

\* \* \* \* \*